United States Patent
Mann (10) Patent No.: US 8,576,376 B2
(45) Date of Patent: Nov. 5, 2013

(54) IMAGING OPTICAL SYSTEM AND PROJECTION EXPOSURE SYSTEM FOR MICROLITHOGRAPHY

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 454 days.

(21) Appl. No.: 12/767,521

(22) Filed: Apr. 26, 2010

(65) Prior Publication Data

US 2010/0231885 A1 Sep. 16, 2010

Related U.S. Application Data

(63) Continuation of application No. PCT/EP2008/008381, filed on Oct. 2, 2008.

(60) Provisional application No. 60/982,785, filed on Oct. 26, 2007.

(30) Foreign Application Priority Data

Oct. 26, 2007 (DE) .................. 10 2007 051 670

(51) Int. Cl.
  *G03B 27/70* (2006.01)
  *G03B 27/52* (2006.01)
(52) U.S. Cl.
  USPC ............... 355/66; 355/51; 355/53; 355/67; 378/34
(58) Field of Classification Search
  USPC ................ 355/51, 53, 66, 67; 378/34
  See application file for complete search history.

(56) References Cited

U.S. PATENT DOCUMENTS

| 4,804,258 A | 2/1989 | Kebo |
| 6,750,948 B2 | 6/2004 | Omura |

(Continued)

FOREIGN PATENT DOCUMENTS

| CN | 1 612 052 A | 5/2005 |
| DE | 10 2005 042 005 | 7/2006 |

(Continued)

OTHER PUBLICATIONS

English translation of Chinese Office Action corresponding to CN Application No. 2008 8011 3375.1, dated Jun. 24, 2011.

(Continued)

*Primary Examiner* — Thomas R Artman
(74) *Attorney, Agent, or Firm* — Fish & Richardson P.C.

(57) ABSTRACT

An imaging optical system includes a plurality of mirrors that image an object field in an object plane into an image field in an image plane. At least one of the mirrors is obscured, and thus has a opening for imaging light to pass through. The fourth-last mirror in the light path before the image field is not obscured and provides, with an outer edge of the optically effective reflection surface thereof, a central shadowing in a pupil plane of the imaging optical system. The distance between the fourth-last mirror and the last mirror along the optical axis is at least 10% of the distance between the object field and the image field. An intermediate image, which is closest to the image plane, is arranged between the last mirror and the image plane. The imaging optical system can have a numerical aperture of 0.9. These measures, not all of which must be effected simultaneously, lead to an imaging optical system with improved imaging properties and/or reduced production costs.

26 Claims, 7 Drawing Sheets

(56) References Cited

U.S. PATENT DOCUMENTS

| | | | |
|---|---|---|---|
| 6,894,834 B2 * | 5/2005 | Mann et al. | 359/366 |
| 7,050,152 B2 | 5/2006 | Terashima et al. | |
| 7,209,286 B2 | 4/2007 | Mann et al. | |
| 7,626,770 B2 | 12/2009 | Singer et al. | |
| 7,682,031 B2 | 3/2010 | Mann et al. | |
| 2002/0056815 A1 | 5/2002 | Mann et al. | |
| 2002/0154395 A1 | 10/2002 | Mann et al. | |
| 2003/0021026 A1 | 1/2003 | Allan et al. | |
| 2004/0057134 A1 | 3/2004 | Dinger | |
| 2004/0070743 A1 * | 4/2004 | Hudyma et al. | 355/67 |
| 2004/0114217 A1 | 6/2004 | Mann et al. | |
| 2005/0122498 A1 | 6/2005 | Jasper | |
| 2005/0173653 A1 | 8/2005 | Yamada | |
| 2006/0232867 A1 | 10/2006 | Mann et al. | |
| 2007/0236784 A1 | 10/2007 | Singer et al. | |
| 2008/0118849 A1 | 5/2008 | Chandhok et al. | |
| 2008/0170310 A1 | 7/2008 | Mann | |
| 2008/0316451 A1 | 12/2008 | Mann et al. | |
| 2009/0244696 A1 | 10/2009 | Geyl et al. | |
| 2010/0231886 A1 | 9/2010 | Mann | |
| 2010/0265481 A1 | 10/2010 | Mann | |
| 2012/0236282 A1 | 9/2012 | Mann | |

FOREIGN PATENT DOCUMENTS

| | | |
|---|---|---|
| DE | 10 2006 017 336 | 10/2007 |
| EP | 0 267 766 | 5/1988 |
| EP | 0 689 075 | 12/1995 |
| EP | 0 799 528 | 6/1997 |
| EP | 1 093 021 | 4/2001 |
| EP | 1 093 031 | 4/2001 |
| EP | 1 434 093 | 6/2004 |
| EP | 1 825 315 | 8/2007 |
| EP | 1 930 771 | 6/2008 |
| JP | 09 213618 | 8/1997 |
| JP | 2001-185480 | 7/2001 |
| JP | 2005-500566 | 1/2005 |
| JP | 2007-514192 | 5/2007 |
| JP | 2008-176326 | 7/2008 |
| JP | 2008-525831 | 7/2008 |
| JP | 2009-532891 | 9/2009 |
| JP | 2010-510666 | 4/2010 |
| WO | WO 96/19871 | 6/1996 |
| WO | 2005/059617 | 6/2005 |
| WO | WO 2005/098506 | 10/2005 |
| WO | WO 2006/063605 | 6/2006 |
| WO | WO 2006/069725 | 7/2006 |
| WO | WO 2006/119977 | 11/2006 |
| WO | WO 2008/063825 | 5/2008 |
| WO | WO 2009/052962 | 4/2009 |
| WO | WO 2009/053023 | 4/2009 |

OTHER PUBLICATIONS

Hudyma, "An Overview of Optical Systems for 30 nm Resolution Lithography at EUV Wavelengths," Proc. of SPIE, vol. 4832, Dec. 1, 2002, pp. 137-148.

D.A. Tichenor et al., "EUV Engineering Test Stand", Lawrence Livermore National Laboratory, Feb. 14, 2000, Figs. 6 (preprint UCRL-JC-137668).

Japanese Office Action, with English translation, for corresponding JP Appl No. 2010-530298, dated Nov. 29, 2012.

Code V Reference Manual, pp. 2A-114 and 2A-415 (1999).

Code V Reference Manual, pp. 173 and 237-239 (2012).

* cited by examiner

IMAGING OPTICAL SYSTEM AND PROJECTION EXPOSURE SYSTEM FOR MICROLITHOGRAPHY

CROSS-REFERENCE TO RELATED APPLICATIONS

This application is a continuation of PCT/EP2008/008381, filed on Oct. 2, 2008, which claims benefit of Provisional Application No. 60/982,785, filed on Oct. 26, 2007, and to German Application No. 10 2007 051 670.5, filed Oct. 26, 2007. The entire contents of each of the above-referenced applications is incorporated herein by reference.

The disclosure relates to imaging optical systems, to projection exposure systems including an imaging optical system, methods for producing microstructured components, and microstructured components produced with these methods.

BACKGROUND

Examples of imaging optical systems are described in U.S. Pat. No. 6,750,948 B2, US 2006/0232867 A1, EP 0 267 766 A2, U.S. Pat. No. 7,209,286 B2 and WO 2006/069 725 A1.

In particular for use within a projection exposure system for microlithography, in particular for the production of microstructured or nano-structured semiconductor components, there is a need for improved imaging properties of imaging optical systems. For example, in imaging optical systems composed of mirrors, it can be desirable to provide a greater numerical aperture or a better correction of imaging errors. Alternatively or additionally, there is a need for simpler manufacture of mirrors at pre-specified dimensions, or for a mirror arrangement that relaxes the requirements on the production of the mirror support in particular, at least for individual mirrors. For example, the number of optical elements required for the imaging and for the correction of imaging errors should be kept as low as possible.

SUMMARY

It has been found that imaging optical systems having a mirror that determines, with the outer edge thereof and not with an opening, a pupil obscuration of an obscured optical system, can provide high-aperture objectives with well-corrected imaging errors. The outer edge of the mirror (e.g., which can be a fourth-last mirror in the light path of the imaging optical system) which surrounds the optically effective reflection surface thereof, is either the outer edge of the optically effective reflection surface itself, or the outer edge of a substrate on which the reflection surface is provided, or the outer edge of a mechanical holding structure supporting the reflection surface or the substrate.

A convex fourth-last mirror in the light path of the imaging optical system can allow the imaging optical system to be constructed with relatively low pupil obscuration.

In some embodiments, it is possible to apply an aperture stop to the fourth-last mirror in the light path.

In some embodiments, an advantageously large space is present between the fourth-last and last mirrors. Such embodiments can advantageously avoid problems associated with other imaging optical systems having obscured mirrors and a high numerical aperture in which the region between the fourth-last and the last mirror was a problematically small meaning that either only very thin mirrors or a mirror which was very expensive to produce, comprising reflective coatings on both sides, could be used there.

In certain embodiments, moving the intermediate image plane in the direction of an image plane of the imaging optical system leads, by comparison with other constructions, to reduced requirements on the optical effect of the last two mirrors of the imaging optical system. In contrast, in certain known obscured systems, the intermediate image plane is often spatially arranged at approximately the height of the last mirror in the light path. It has been found that this is not a compulsory requirement because the last mirror in the light path is mostly not decisive as regards the pupil obscuration, in such a way that a relatively large central opening, and thus an intermediate plane separated from the reflection surface of the penultimate mirror, can be tolerated there.

In some embodiments, a distance between an intermediate image and the image plane, along the optical axis, is at most 0.95 times the distance, from the image plane, of the last mirror in the light path. A distance from the image plane of the last mirror in the light path is defined as the distance from the image plane of the piercing point of an optical axis of the imaging optical system through the reflection surface of this mirror. In the case where the optical axis does not pass through the reflection surface of the mirror, i.e., in the case, for example, of an off-axis mirror, the piercing point of the optical axis through a surface which carries on continuously in accordance with the optical design input is selected instead of the piercing point of the optical axis through the reflection surface. If the mirror is rotationally symmetric about the optical axis, this piercing point coincides with the centre of the reflection surface of the mirror. In the case where this last mirror is obscured, the centre of the reflection surface may also lie in the obscuration opening, in which case it is assumed that the reflection surface carries on continuously within the obscuration opening in accordance with the optical design input. The distance of the intermediate image plane from the image plane may for example, be 0.7, 0.8 or 0.9 times the distance of the last mirror in the light path from the image plane.

In some embodiments, imaging optical systems have a numerical aperture of at least 0.4 (e.g., at least 0.5, at least 0.6, at least 0.9).

In certain embodiments, imaging optical systems include fewer than 10 mirrors and have a numerical aperture of ≥0.7.

In some embodiments, imaging optical systems include exactly eight mirrors and have a numerical aperture of 0.9.

Imaging optical systems can have a maximum root mean square (rms) wavefront error of less than 10 nm (e.g., less than 5 nm, less than 2 nm, less than 1 nm, less than 0.5 nm).

Such imaging properties can be advantageous for achieving a high local resolution over the whole field. These imaging properties can be independent of the wavelength of the imaging light. The wavelength of the imaging light can range from the EUV range to the visible spectrum. Wavefront errors are preferred which lead to a diffraction limited resolution and which are therefore, in particular, less than one fourteenth of the imaging light wavelength. For EUV wavelengths, a wavefront error which has a root mean square (rms) of less than 1 nm leads to a resolution which is, in practice, diffraction limited.

In some embodiments, the imaging optical system has a maximum distortion of less than 10 nm (e.g., less than 2 nm, less than 0.5 nm).

In certain embodiments, the imaging optical system has a pupil obscuration of less than 20% (e.g., less thank 15%, less than 10%).

A low pupil obscuration, i.e., the proportion of the pupil surface which cannot be used because of the central pupil obscuration, can lead to an advantageously high light throughput for the imaging optical system. Additionally, an imaging optical system with a low pupil obscuration can be more widely used, because the lower the pupil obscuration, the greater the bandwidth of the available illumination means. Imaging optical systems with low pupil obscurations therefore provide high-contrast imaging substantially independently of the type of object structure to be imaged.

Field planes arranged parallel to one another can facilitate the integration of the imaging optical system into structural surroundings. This advantage may be particularly significant when the imaging optical system is used in a scanning projection exposure system, since the scan directions can then be guided parallel to one another.

In certain embodiments, imaging optical systems can have an image field larger than 1 mm² (e.g., having side lengths of 1 mm and 13 mm). Such image field sizes can lead to a good throughput when the imaging optical system is used in a projection exposure system. Other dimensions of the long and short image field sides are also possible. The short image field sides may also be less than 1 mm or greater than 1 mm. The long image field sides may, for example, also be 5 mm, 10 mm or 15 mm.

Imaging optical systems can have a reduction image scale of eight. Such an imaging scale can allow a low angle of incidence on a reflection mask when using the imaging optical system in a projection exposure system. In this type of application, the use of an imaging scale of this type does not lead to the requirement of unnecessarily large masks.

In some embodiments, an odd number of obscured mirrors are used. For example, three mirrors could be obscured.

Imaging optical systems can include at least one intermediate image, e.g., positioned at a plane folded in the vicinity of a pupil plane (e.g., coinciding with the pupil plane). Such an arrangement can lead to the possibility, in a spatially restricted arrangement, of exerting influences both in a field plane and in a pupil plane of the imaging optical system. This can be particularly expedient for correction purposes.

Principal rays of imaging optical systems can extend divergently to neighbouring field points in the light path from an object plane of the imaging optical system to the first mirror in the light path. Such embodiments can lead to the possibility of supplying on the imaging optical system, directly and without the interposition of additional imaging elements, from a preceding illumination optical system via a pupil component which is the last element before the imaging optical system, it then being possible for this pupil component to be arranged in the pupil plane of the imaging optical system, which plane is disposed so as to precede said imaging optical system.

In certain embodiments, imaging optical systems include exactly six mirrors and form two intermediate images. Such embodiments can be used on the one hand for compact beam guidance and also, on the other hand, for correction purposes.

Projection exposure systems can include an imaging optical system, a light source, and an illumination optical system for guiding light from the light source to the imaging optical system. The light source of the projection exposure system may be in the form of a broadband light source and may have, for example, a bandwidth greater than 1 nm, greater than 10 nm or greater than 100 nm. In addition, the projection exposure system may be constructed in such a way that it can be operated with light sources of different wavelengths. Light sources for other wavelengths, in particular wavelengths used for microlithography, can be used in conjunction with the imaging optical system, for example light sources with wavelengths of 365 nm, 248 nm, 193 nm, 157 nm, 126 nm and 109 nm, and in particular also with wavelengths which are less than 100 nm.

In certain aspects, the invention features methods for producing a microstructured component that include providing a reticle and a wafer, projecting a structure on the reticle onto a light sensitive layer of the a wafer by using a projection exposure system, and producing a microstructure on the wafer.

BRIEF DESCRIPTION OF THE DRAWINGS

Embodiments will be described in the following in greater detail with reference to the drawings, in which.

is a view of an embodiment of an imaging optical system, in meridional section.

DETAILED DESCRIPTION

A projection exposure system 1 for microlithography has a light source 2 for illumination light. The light source 2 is an EUV light source which produces light in a wavelength range in particular of between 10 nm and 30 nm. Other EUV wavelengths are also possible. In general, any desired wavelengths, for example visible wavelengths or any other wavelengths which are used, for example, in microlithography and are available for the appropriate laser light sources and/or LED light sources (for example 365 nm, 248 nm, 193 nm, 157 nm, 129 nm or 109 nm), are possible for the illumination light guided in the projection exposure system 1. A light path of the illumination light 3 is shown extremely schematically in FIG. 1.

An illumination optical system 6 guides the illumination light 3 from the light source 2 to an object field 4 (cf. FIG. 2) in an object plane 5. The object field 4 is imaged into an image field 8 (cf. FIG. 2) in an image plane 9, at a pre-specified reduction scale, with a projection optical system 7. Embodiments shown in FIGS. 2 to 7 may be used for the projection optical system 7. The projection optical system 7 shown in FIG. 2 has a reduction factor of 8. Other reduction scales are also possible, for example 4×, 5×, or even reduction scales that are greater than 8×. An imaging scale of 8× is particularly suitable for illumination light 3 with an EUV wavelength, since the object-side angle of incidence on a reflection mask 10 can thus remain small. An imaging scale of 8× also may not need the use of unnecessarily large masks. In the projection optical system 7 in the embodiments shown in FIGS. 2 to 7, the image plane 9 is arranged parallel to the object plane 5. A portion of the reflective mask 10, also known as a reticle, coinciding with the object field 4 is hereby imaged.

Figure 2:
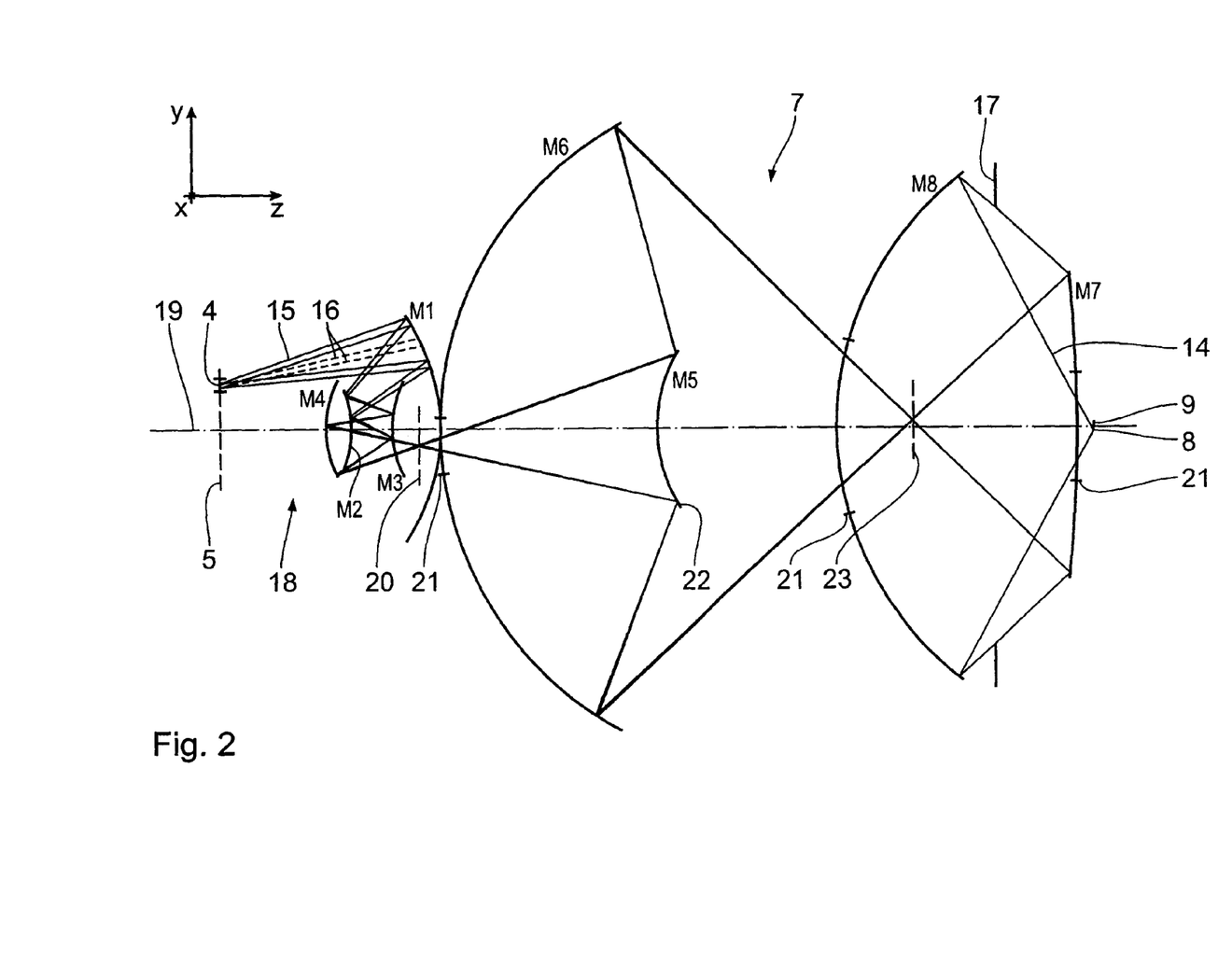
FIG. 2 is a view of an embodiment of an imaging optical system, in meridional section.

The image field 8 is bent in an arc shape, the distance between the two arcs which delimit the image field 8 being 1 mm. 1 mm is also the side length of the straight side edges which delimit the image field 8 between the two arcs and which extend parallel to one another. These two straight side edges of the image field 8 are at a distance of 13 mm from one another. The surface of this curved image field corresponds to a rectangular image field with side lengths of 1 mm×13 mm. A square image field 8 of this type is also possible.

Figure 1:
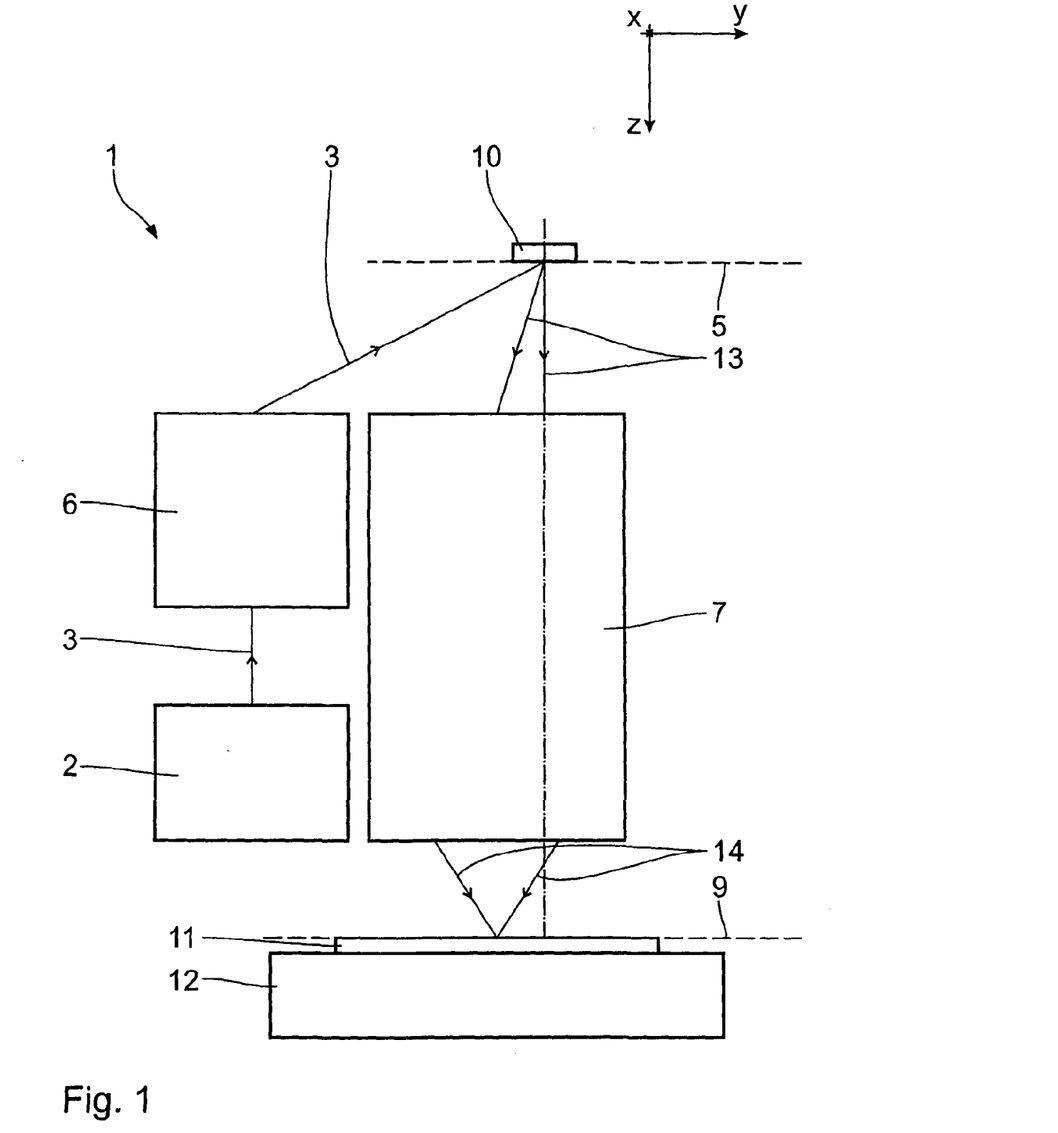
FIG. 1 is a schematic view of a projection exposure system for EUV microlithography.

Imaging takes place on the surface of a substrate 11 in the form of a wafer which is supported by a substrate holder 12. In FIG. 1, a light beam 13 of the illumination light 3 entering the projection optical system 7 is shown schematically between the reticle 10 and said projection optical system, and a light beam 14 of the illumination light 3 exiting from the projection optical system 7 is shown schematically between the projection optical system 7 and the substrate 11.

The image field-side numerical aperture of the projection optical system 7 shown in FIG. 2 is 0.9. This is not reproduced to scale in FIG. 1 for visual reasons.

In order to aid the description of the projection exposure system 1 and the various embodiments of the projection optical system 7, an xyz Cartesian coordinate system is provided in the drawings and shows the respective locations of the components represented in the figures. In FIG. 1, the x direction extends perpendicular to and into the drawing plane. The y direction extends to the right and the z direction extends downwards.

The projection exposure system 1 is a scanner-type device. Both the reticle 10 and the substrate 11 are scanned in the y direction during operation of the projection exposure system 1.

FIG. 2 shows the optical construction of a first embodiment of the projection optical system 7. The light path of each of two individual rays 15, which proceed in each case from two object field points in FIG. 2 and are distanced from one another in the y direction, is shown. The two individual rays 15, which belong to one of these two object field points, are each associated with two different illumination directions for the two image field points. The individual rays 15, associated with the same illumination direction, of different field points extend divergently proceeding from the object plane 5. This is also referred to in the following as a negative input back focal length or a negative back focal length of the entrance pupil. An entrance pupil of the projection optical system 7 shown in FIG. 2 lies not inside the projection optical system 7, but before the object plane 5 in the light path. This makes it possible, for example, to arrange a pupil component of the illumination optical system 6 in the entrance pupil of the projection optical system 7, before the projection optical system 7 in the light path, without further imaging optical components having to be present between these pupil components and the object plane 5.

The projection optical system 7 shown in FIG. 2 has a total of eight mirrors, which are numbered in the sequence of the light path, proceeding from the object field 4, as M1 to M8. FIG. 2 shows only the calculated reflection surfaces of the mirrors M1 to M8.

The optical data for the projection optical system 7 shown in FIG. 2 are shown in the following by means of two tables. In the column "radius", the first table shows in each case the radius of curvature of the mirrors M1 to M8. The third column (thickness) describes the distance, proceeding from the object plane 5, to the following surface in each case.

The second table describes the precise surface form of the reflection surfaces of the mirrors M1 to M8, where the constants K and A to J are to be put into the following equation for the sagittal height:

$$z(h) = \frac{ch^2}{1 + SQRT\{1 - (1-K)c^2h^2\}} + +Ah^4 + Bh^6 + Ch^8 + Dh^{10} + Eh^{12} + Fh^{14} + Gh^{16} + Hh^{18} + Jh^{20}$$

In this case, h represents the distance from the optical axis 19. Therefore: $h^2 = x^2 + y^2$. The reciprocal of "radius" is used for c.

| Surface | Radius (1/c) | Thickness | Operating mode |
|---|---|---|---|
| Object plane | infinity | 517.466 | |
| M1 | −460.153 | −217.028 | REFL |
| M2 | −380.618 | 101.780 | REFL |
| M3 | 304.428 | −158.351 | REFL |
| M4 | 248.577 | 786.055 | REFL |
| M5 | 320.928 | −512.457 | REFL |
| M6 | 826.181 | 1504.412 | REFL |
| M7 | −3221.704 | −191.095 | REFL |
| stop | infinity | −375.302 | |
| M8 | 750.83 | 606.397 | REFL |
| Image plane | infinity | 0 | |

| Surface | K | A | B | C | D |
|---|---|---|---|---|---|
| M1 | 0.000000E+00 | −1.631597E−10 | 9.657530E−16 | −6.306626E−20 | 1.072197E−24 |
| M2 | −7.342117E+00 | −3.247790E−08 | 1.007295E−13 | −2.908653E−18 | −6.581368E−21 |
| M3 | −8.421287E+00 | 1.604616E−09 | 1.164266E−11 | −7.638324E−15 | 2.158838E−18 |
| M4 | 5.504873E−02 | −2.854695E−10 | 1.302845E−15 | 7.411326E−19 | −1.319473E−22 |
| M5 | −2.441303E−02 | −4.072151E−09 | −5.877441E−14 | 2.214912E−18 | −8.175465E−23 |
| M6 | 3.411049E−03 | −7.680740E−12 | −7.621133E−18 | −6.837917E−24 | −8.305886E−30 |
| M7 | −2.544754E+00 | 5.119174E−10 | −8.412525E−16 | 8.746864E−21 | −4.053738E−26 |
| M8 | 1.012485E−01 | −6.355004E−11 | −1.261118E−16 | −6.586951E−24 | −4.143278E−28 |

| Surface | E | F | G | H | J |
|---|---|---|---|---|---|
| M1 | −1.289213E−29 | 8.646860E−35 | −2.746050E−40 | 0.000000E+00 | 1.075412E−51 |
| M2 | 1.743214E−24 | −2.256980E−28 | 1.288821E−32 | 0.000000E+00 | −2.146208E−41 |
| M3 | 2.665732E−25 | 1.001342E−24 | −1.896580E−27 | 1.213404E−30 | −2.772775E−34 |
| M4 | 1.642304E−26 | −1.185339E−30 | 4.697782E−35 | −7.812489E−40 | 0.000000E+00 |
| M5 | 1.783031E−27 | −3.302179E−32 | 6.356237E−37 | −8.439168E−42 | 3.970026E−47 |
| M6 | −1.193959E−35 | 3.014822E−41 | −1.666695E−46 | 2.921935E−52 | −2.589560E−58 |

-continued

| | | | | | |
|---|---|---|---|---|---|
| M7 | 1.405577E−31 | 1.660762E−37 | −4.750000E−42 | 2.390150E−47 | −4.132019E−53 |
| M8 | 3.396965E−35 | 3.588060E−40 | −3.053788E−45 | 6.807302E−51 | −1.109855E−56 |

The mirrors M1, M2 and M4 of a first mirror group 18, which includes the mirrors M1 to M4, are shaped as ring segments and are used off-axis with respect to the optical axis 19—completely in the case of the mirrors M1 and M2 and for the most part in the case of the mirror M4. The employed optical reflection surface of the mirrors M, M2 and—for the most part—M4 thus lies at a distance from the optical axis 19. The reflection surfaces of all the mirrors M1 to M8 are rotationally symmetric about the optical axis 19.

The employed reflection surface of the mirror M3 is approximately centred on the optical axis 19 (on-axis).

The mirrors M1, M4, M6, M7 and M8 are concave mirrors. The mirrors M2, M3 and M5 are convex mirrors.

An intermediate image plane 20 of the projection optical system 7 lies between the mirrors M4 and M5. As their course continues, the individual rays 15 pass through an opening 21 in the mirror M6. The mirror M6 is used around opening 21. The mirror M6 is thus an obscured mirror. As well as the mirror M6, the mirrors M7 and M8 are also obscured and both likewise include a opening 21.

The mirror M5, i.e. the fourth-last mirror in the light path before the image field 8, is not obscured and thus has no opening for imaging light. An outer edge 22 of the optically effective reflection surface of the mirror M5 provides a central shadowing of the projection optical system 7, i.e., of the imaging optical system, in the pupil plane 17. The mirror M5 therefore shadows the light path between the mirrors M6 and M7.

The mirror M5 is arranged on the optical axis 19 and lies approximately centrally on said optical axis 19.

In the embodiment shown in FIG. 2, the distance between the mirror M5 and the last mirror M8, which are arranged back-to-back in terms of the reflective effect thereof, is approximately 20.6% of the distance between the object plane 5 and the image plane 9 and, in particular, approximately 20% of the marginally greater distance between the object field 4 and the image field 8. A substantially greater space is thus present in the optical system 7 between the mirrors M5 and M8.

A further intermediate plane 23 lies between the mirror M6 and the mirror M7 in the light path. This is the intermediate image plane which is closest to the image plane 9. This intermediate image plane 23 lies spatially between the last mirror M8 in the light path and the image plane 9. The distance of the intermediate image plane 23 from the image plane 9 is approximately 0.7 times the distance of the last mirror M6 in the light path from the image plane 9.

The projection optical system 7 shown in FIG. 2 has a maximum root mean square (rms) wavefront error of 0.9 nm. The distortion of the projection optical system 7 is at most 0.5 nm. The pupil obscuration, i.e., the ratio of a central shadowed surface portion in the pupil plane 17 to the whole surface within an illuminated edge contour in the pupil plane 17, is 11.6%.

Figure 3:
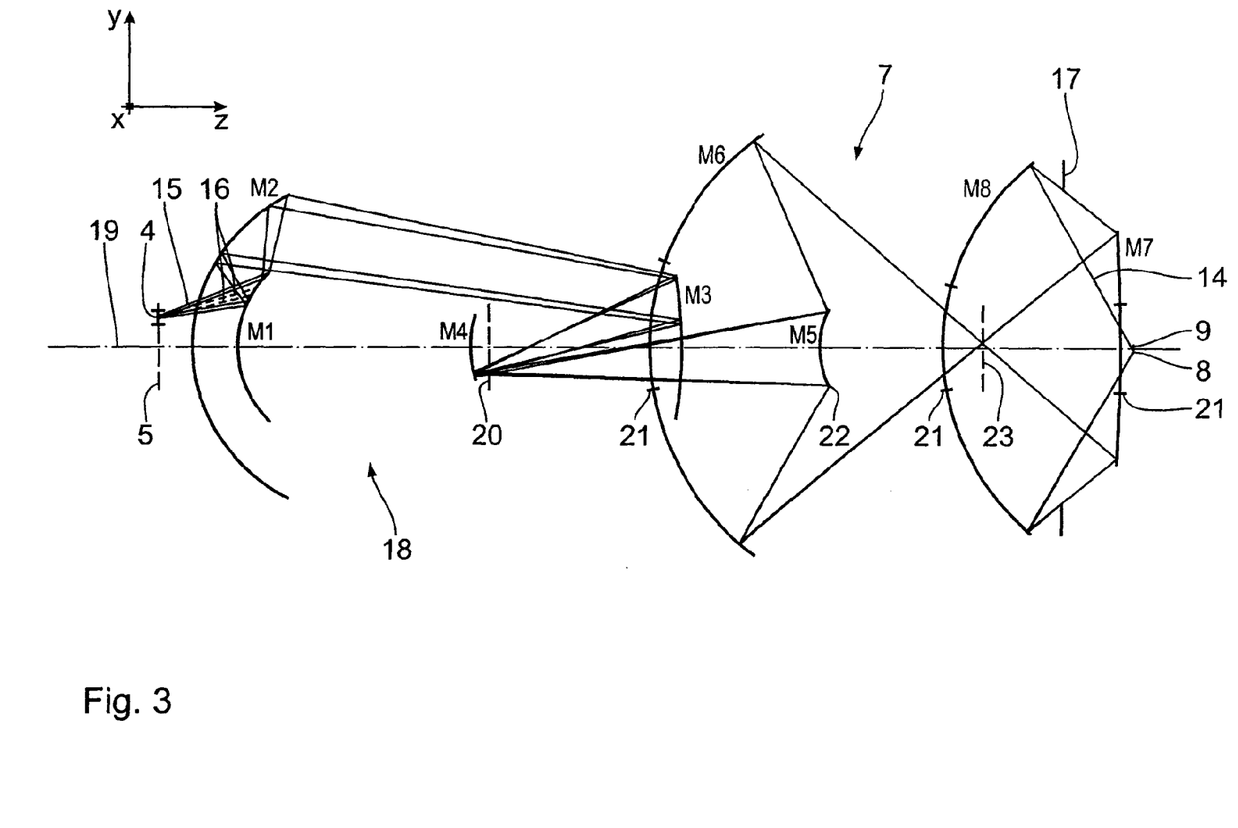
FIG. 3 is a view of an embodiment of an imaging optical system, in meridional section.

FIG. 3 shows a further embodiment of a projection optical system 7. Components and features which correspond to those that have previously been described with reference to FIGS. 1 and 2 have the same reference numerals and will not be discussed in detail again.

The optical data for the projection optical system 7 shown in FIG. 3 are shown in the following by means of two tables, which correspond in layout to the tables for FIG. 2.

| Surface | Radius (1/c) | Thickness | Operating mode |
|---|---|---|---|
| Object plane | infinity | 240.357 | |
| M1 | 306.212 | −140.357 | REFL |
| M2 | 472.863 | 1508.127 | REFL |
| M3 | −1214.568 | −651.640 | REFL |
| M4 | 371.570 | 1076.156 | REFL |
| M5 | 210.825 | −524.516 | REFL |
| M6 | 793.298 | 1450.998 | REFL |
| M | −3402.480 | −176.337 | REFL |
| stop | infinity | −366.873 | |
| M8 | 734.006 | 584.084 | REFL |
| Image plane | infinity | 0.000 | |

| Surface | K | A | B | C | D |
|---|---|---|---|---|---|
| M1 | 0.000000E+00 | 5.528998E−09 | −4.968534E−13 | 1.659177E−17 | −3.863442E−22 |
| M2 | −6.538633E−01 | 5.913642E−10 | −2.068085E−15 | 1.843758E−20 | −6.714355E−26 |
| M3 | 0.000000E+00 | 9.809893E−10 | 1.757665E−15 | 6.252623E−20 | −7.383824E−25 |
| M4 | 2.740280E+00 | −4.880461E−08 | 8.522603E−12 | −1.221389E−15 | 1.142980E−19 |
| M5 | −5.973645E−02 | −1.313275E−08 | −1.603339E−13 | 2.016611E−18 | −4.373542E−22 |
| M6 | 4.517989E−02 | −1.639817E−11 | −1.843198E−17 | −2.050197E−23 | −3.219956E−29 |
| M7 | −1.286534E+01 | 4.603123E−10 | −1.024577E−15 | 1.178213E−20 | −7.426445E−26 |
| M8 | 9.856773E−02 | −8.505963E−11 | −1.255661E−16 | −1.224739E−22 | −3.390517E−28 |

| Surface | E | F | G | H | J |
|---|---|---|---|---|---|
| M1 | 5.540209E−27 | −4.791768E−32 | 2.229758E−37 | −4.553644E−43 | 0.000000E+00 |
| M2 | 1.572034E−31 | −1.728552E−37 | 1.501360E−43 | 0.000000E+00 | 0.000000E+00 |
| M3 | 8.354870E−30 | −3.768113E−35 | 0.000000E+00 | 4.020897E−45 | 0.000000E+00 |
| M4 | −6.828562E−24 | 2.234887E−28 | −2.050695E−33 | −5.185597E−38 | 0.000000E+00 |
| M5 | 2.682717E−26 | −1.836495E−30 | 8.559900E−35 | −1.643140E−39 | 0.000000E+00 |

-continued

| | | | | | |
|---|---|---|---|---|---|
| M6 | 2.845752E−35 | −2.880170E−40 | 5.575425E−46 | −7.139928E−52 | 0.000000E+00 |
| M7 | 4.719915E−31 | −2.246586E−36 | 6.923567E−42 | −9.256971E−48 | 0.000000E+00 |
| M8 | 5.071111E−34 | −2.813625E−39 | 6.372889E−45 | −9.981207E−51 | 0.000000E+00 |

The embodiment shown in FIG. 3 differs from that shown in FIG. 2 by virtue of the arrangement of the first mirror group 18 including the mirrors M1 to M4. All four mirrors M1 to M4 of the first mirror group 18 of the projection optical system 7 shown in FIG. 3 are supplied off-axis via a light source. The mirror M1 is convex and the mirrors M2 to M4 are concave.

The projection optical system 7 shown in FIG. 3 has a negative back focal length of the entrance pupil. In other words, object plane 5 is positioned along optical axis 19 between the entrance pupil and the mirrors composing projection optical system 7.

The first intermediate image plane 20 is arranged in the region of the mirror M4 in the embodiment shown in FIG. 3. According to the precise configuration of the mirror construction, the associated intermediate image can be arranged before the mirror M4, on the mirror M4, or even after the mirror M4.

In the embodiment shown in FIG. 3, the mirror M3 lies not to the left of the mirror M6, as in the embodiment shown in FIG. 2, but at the level of the optical axis 19 to the right of the mirror M6. The rays 15 pass through the mirror M6 on the way from the mirror M2 to the mirror M3, exactly like the rays 15 on the way from the mirror M3 to the mirror M4 and on the way from the mirror M4 to the mirror M5. The opening 21 in the mirror M6 is thus passed through thrice by the individual rays 15.

In the projection optical system 7 shown in FIG. 3, the distance between the mirrors M5 and M8 is approximately 12.8% of the distance between the object plane 5 and the image plane 9. The distance of the intermediate image plane 23 from the image plane 9 is approximately 0.8 times the distance of the last mirror M6 in the light path from the image plane 9.

The maximum (rms) wavefront error of the projection optical system 7 shown in FIG. 3 is 2.2 nm. The maximum distortion is 5 nm. The pupil obscuration is 8.4%.

Figure 4:
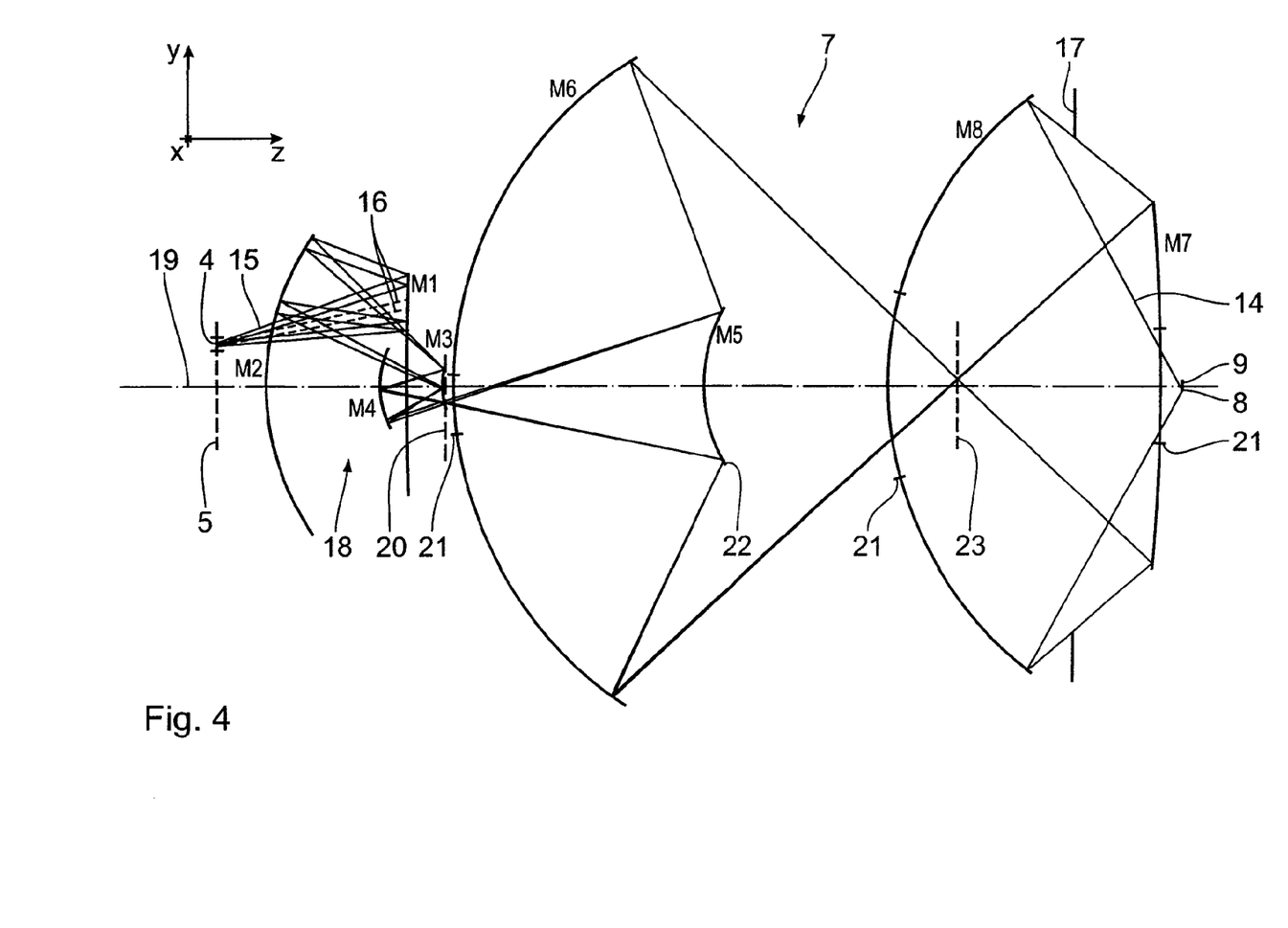

FIG. 4 shows a further embodiment of a projection optical system 7. Components and features which correspond to those that have previously been described with reference to FIGS. 1 and 2 have the same reference numerals and will not be discussed in detail again.

The optical data for the projection optical system 7 shown in FIG. 4 are shown in the following by means of two tables, which correspond in layout to the tables for FIG. 2.

| Surface | Radius (1/c) | Thickness | Operating mode |
|---|---|---|---|
| Object plane | infinity | 390.160 | |
| M1 | 5657.607 | −290.160 | REFL |
| M2 | 547.829 | 364.027 | REFL |
| M3 | 150.329 | −131.050 | REFL |
| M4 | 182.077 | 674.854 | REFL |
| M5 | 301.845 | −517.671 | REFL |
| M6 | 809.621 | 1464.069 | REFL |
| M7 | −3032.589 | −177.803 | REFL |
| stop | infinity | −377.065 | |
| M8 | 753.606 | 600.638 | REFL |
| Image plane | infinity | 0.000 | |

| Surface | K | A | B | C | D |
|---|---|---|---|---|---|
| M1 | 0.000000E+00 | −2.662522E−10 | −5.535133E−15 | 9.951400E−20 | −1.728701E−24 |
| M2 | 0.000000E+00 | −7.758511E−11 | −4.927920E−16 | −2.380995E−21 | 1.771881E−27 |
| M3 | 0.000000E+00 | 2.187978E−08 | −4.324024E−12 | −2.166837E−15 | 6.601874E−19 |
| M4 | 0.000000E+00 | 1.844448E−09 | 6.801387E−14 | 2.528119E−17 | −6.128096E−21 |
| M5 | 1.156883E−04 | −6.361997E−09 | −4.599504E−14 | 1.885582E−18 | −6.053781E−23 |
| M6 | 3.259720E−02 | −1.077005E−11 | −1.049275E−17 | −1.178590E−23 | −1.688268E−30 |
| M7 | −8.103305E+00 | 3.958094E−10 | −5.118462E−16 | 5.066772E−21 | −1.825272E−26 |
| M8 | 1.035316E−01 | −7.996215E−11 | −1.253165E−16 | −7.448536E−23 | −2.060928E−28 |

| Surface | E | F | G | H | J |
|---|---|---|---|---|---|
| M1 | 1.574353E−29 | −5.663846E−35 | 0.000000E+00 | 0.000000E+00 | 0.000000E+00 |
| M2 | −1.673915E−31 | 0.000000E+00 | 0.000000E+00 | 0.000000E+00 | 0.000000E+00 |
| M3 | −1.166941E−23 | −9.288602E−26 | 5.378119E−29 | 0.000000E+00 | 0.000000E+00 |
| M4 | 1.073882E−24 | −9.788111E−29 | 3.783735E−33 | 0.000000E+00 | 0.000000E+00 |
| M5 | −4.369093E−28 | 5.123232E−32 | −7.255963E−37 | 0.000000E+00 | 0.000000E+00 |
| M6 | −6.033318E−35 | 1.025297E−40 | −1.418317E−46 | 0.000000E+00 | 0.000000E+00 |
| M7 | 1.004654E−31 | −5.423670E−37 | 2.038001E−42 | −3.000000E−48 | 0.000000E+00 |
| M8 | −4.980960E−34 | 5.995233E−40 | 6.787033E−46 | −4.632967E−51 | 0.000000E+00 |

The projection optical system 7 shown in FIG. 4 also differs from those shown in FIG. 2 and FIG. 3 substantially by virtue of the arrangement of the first mirror group 18 comprising the mirrors M1 to M4. The mirrors M1, M2 and M4 are supplied off-axis. The mirror M3 is convex. The mirrors M1, M2 and M4 are convex. The mirror M1 has such a low curvature that said mirror may not only be concave, but with a slight adaptation of the construction may also be planar or convex.

In the projection optical system 7 of FIG. 4, the first intermediate image plane 20 lies in the light path between the mirrors and M4 and M5, approximately at the level of the mirror M3.

In the embodiment shown in FIG. 4, the mirror M3 is again arranged to the left of the mirror M6, in such a way that the opening 21 of the mirror M6 is only passed through once by the rays 15. With a slight adaptation of the construction, the mirror M3 may also be moved into the opening of the mirror M6.

In the projection optical system 7 shown in FIG. 4, the distance between the mirrors M5 and M8 is approximately 19.6% of the distance between the object plane 5 and the image plane 9. The distance of the intermediate image plane 23 from the image plane 9 is approximately 0.76 times the distance of the last mirror M6 in the light path from the image plane 9.

The maximum (rms) wavefront error of the projection optical system 7 shown in FIG. 4 is 1.4 nm. The maximum distortion is 1.5 nm. The pupil obscuration is 10.9%.

Figure 5:
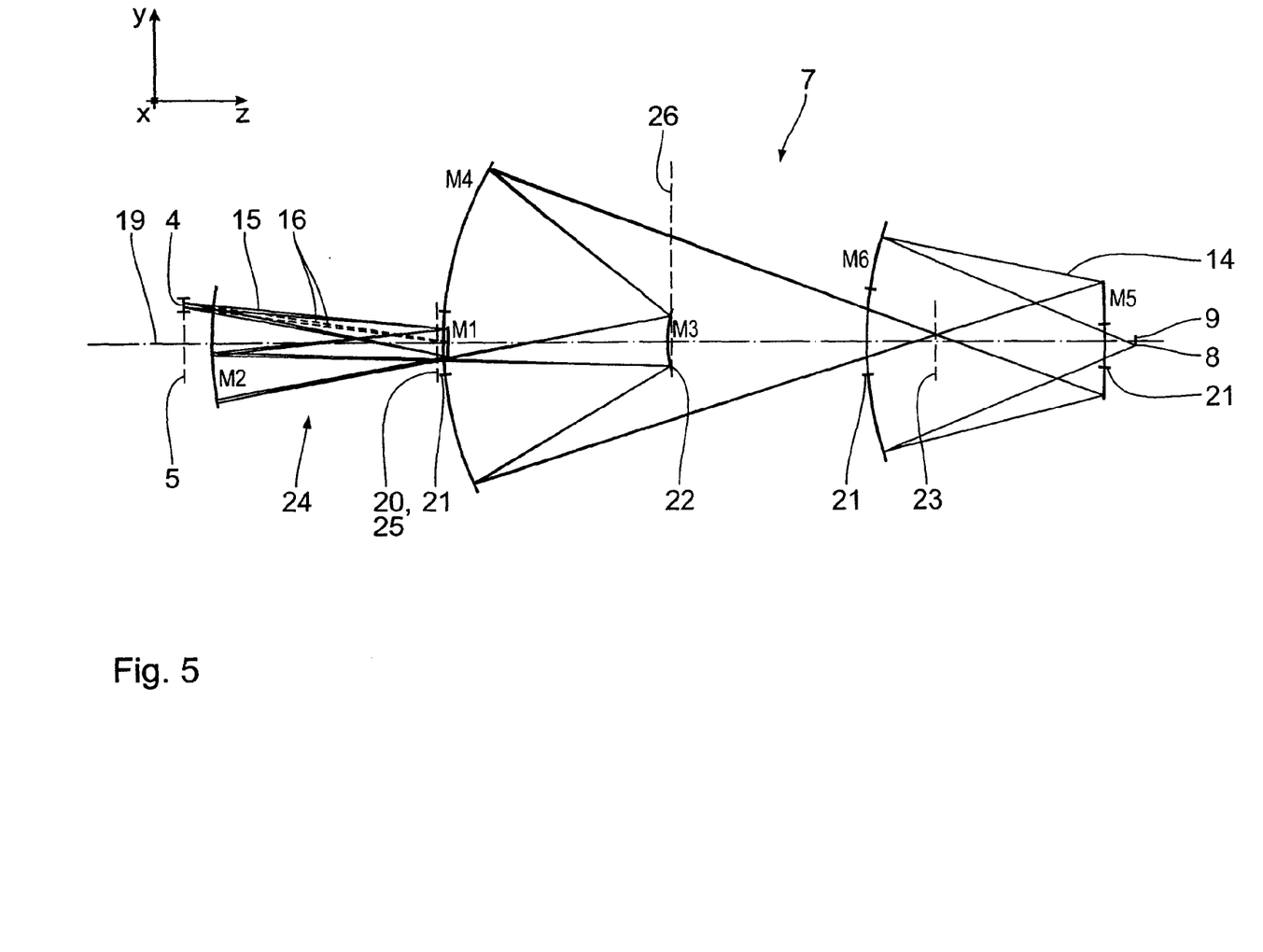
FIG. 5 is a view of an embodiment of an imaging optical system, in meridional section.

FIG. 5 shows a further embodiment of a projection optical system 7. Components and features which correspond to those which have previously been described with reference to FIGS. 1 and 2 have the same reference numerals and will not be discussed in detail again.

The optical data for the projection optical system 7 shown in FIG. 5 are shown in the following by means of two tables, which correspond in layout to the tables for FIG. 2.

The projection optical system 7 shown in FIG. 5 has a total of six mirrors, which are numbered in the sequence of the light path, proceeding from the object field 5, as M1 to M6.

In the projection optical system 7 shown in FIG. 5, a first mirror group 24 includes only two mirrors, namely the mirrors M1 and M2. The mirror M1 is supplied approximately on-axis and the mirror M2 is supplied off-axis. The following mirrors M3 to M6 correspond in arrangement and function to the mirrors M5 to M8 of the embodiments shown in FIGS. 2 to 4.

The projection optical system 7 shown in FIG. 5 has a numerical aperture of 0.4.

The projection optical system 7 according to FIG. 5 has a positive back focal length for the entrance pupil, i.e., principal rays 16 extending initially convergently from the object field 4. The mirror M1 lies in the region of an entrance pupil plane 25 of the projection optical system 7. The first intermediate image plane 20 also lies between the mirrors M2 and M3, likewise approximately at the level of the mirror M1.

The mirror M1 is arranged in the opening 21 of the mirror M4. The opening 21 of the mirror M4 is again passed through thrice, similarly to the mirror M6 in the embodiment shown in FIG. 3.

The fourth-last mirror M3, the outer edge 22 of which again provides the pupil obscuration of the projection optical system 7 shown in FIG. 5, lies in the region of a further pupil plane 26 of the projection optical system 7 shown in FIG. 5. An aperture stop of the projection optical system 7 according to FIG. 5 can therefore be applied to the mirror M3.

The distance between the fourth-last mirror M3 and the last mirror M6 is equal to approximately 21.0% of the distance between the object plane 5 and the image plane 9 in the embodiment shown in FIG. 5. The distance of the intermediate image plane 23 from the image plane 9 is approximately 0.74 times the distance of the last mirror M6 in the light path from the image plane 9.

| Surface | Radius (1/c) | Thickness | Operating mode |
|---|---|---|---|
| Object plane | infinity | 591.532 | |
| M1 | −6782.876 | −530.662 | REFL |
| M2 | 702.707 | 1026.755 | REFL |
| stop | infinity | 0.000 | |
| M3 | 217.303 | −507.993 | REFL |
| M4 | 776.996 | 1490.702 | REFL |
| M5 | −2014.188 | −533.319 | REFL |
| M6 | 791.740 | 603.252 | REFL |
| Image plane | infinity | 0.000 | |

| Surface | K | A | B | C |
|---|---|---|---|---|
| M1 | 0.000000E+00 | 8.899437E−09 | −1.356259E−12 | 2.954130E−15 |
| M2 | −3.639089E+00 | 1.110645E−09 | −2.542191E−15 | 2.297600E−20 |
| M3 | 1.390154E−01 | −1.972567E−08 | 3.444974E−13 | −7.400803E−17 |
| M4 | −2.088645E−02 | −1.996767E−11 | −3.060841E−17 | −4.632700E−23 |
| M5 | −1.390893E+01 | 1.114680E−09 | 1.108176E−15 | 5.215888E−20 |
| M6 | 1.112425E−01 | 6.540015E−11 | 8.340321E−17 | 2.310935E−22 |

| Surface | D | E | F | G |
|---|---|---|---|---|
| M1 | −2.165883E−18 | 0.000000E+00 | 6.325365E−25 | −1.919429E−28 |
| M2 | −1.439457E−24 | 9.400607E−29 | −3.212860E−33 | 4.384528E−38 |
| M3 | 9.862318E−21 | −2.518066E−24 | 3.734400E−28 | −2.241749E−32 |
| M4 | −5.236534E−29 | −6.140963E−35 | −6.134373E−40 | 8.521628E−46 |
| M5 | −1.658708E−24 | 7.482784E−29 | −1.911769E−33 | 1.936176E−38 |
| M6 | −2.192695E−27 | 6.492849E−33 | 1.784557E−37 | −1.082995E−42 |

The projection optical system 7 shown in FIG. 5 has a maximum (rms) wavefront error of 0.4 nm. The maximum distortion is 0.3 nm. The pupil obscuration is 17.6%.

Figure 6:
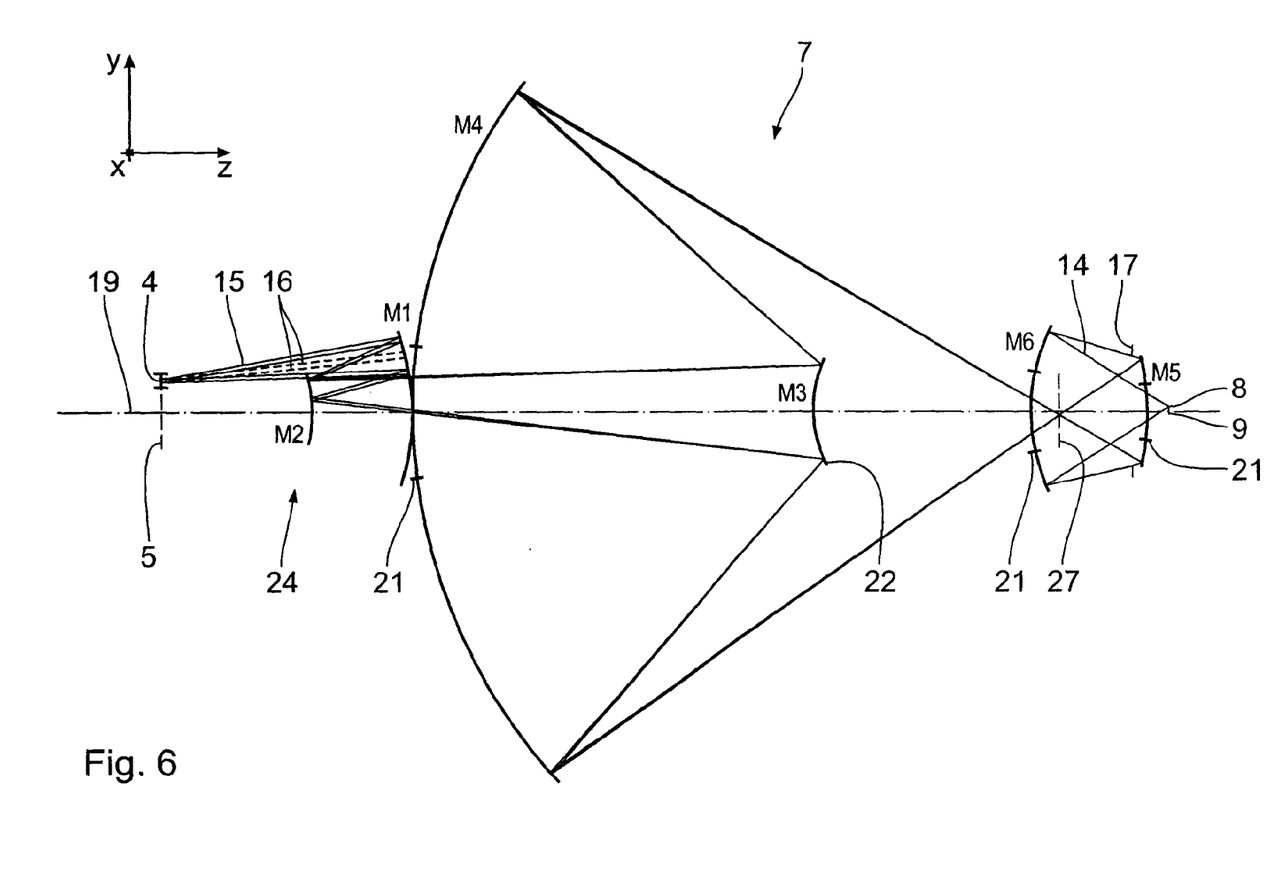
FIG. 6 is a view of an embodiment of an imaging optical system, in meridional section.

FIG. 6 shows a further embodiment of a projection optical system 7. Components and features which correspond to those which have previously been described with reference to FIGS. 1 to 5 have the same reference numerals and will not be discussed in detail again.

The optical data for the projection optical system 7 shown in FIG. 6 are shown in the following by means of two tables, which correspond in layout to the tables for FIG. 2.

which has no focus there and thus has a relatively large diameter, the fourth-last mirror M3 is still the mirror which, with the outer edge 22 thereof, provides the pupil obscuration of the projection optical system 7.

The projection optical system 7 shown in FIG. 6 has a numerical aperture of 0.55.

The distance between the fourth-last mirror M3 and the last mirror M6 is equal to approximately 22% of the distance of the object plane 5 from the image plane 9 in the embodiment of the projection optical system 7 shown in FIG. 6. The distance of the intermediate image plane 23 from the image

| Surface | Radius (1/c) | Thickness | Operating mode |
|---|---|---|---|
| Object plane | infinity | 683.665 | |
| M1 | −694.834 | −271.324 | REFL |
| M2 | −411.527 | 1372.036 | REFL |
| M3 | 346.281 | −1100.613 | REFL |
| M4 | 1469.502 | 2005.780 | REFL |
| M5 | −722.731 | −41.563 | REFL |
| stop | infinity | −272.149 | |
| M6 | 544.465 | 370.467 | REFL |
| Image plane | infinity | 0.000 | |

| Surface | K | A | B | C |
|---|---|---|---|---|
| M1 | 7.396949E−03 | −8.591818E−11 | 2.958631E−15 | −1.515085E−19 |
| M2 | −4.696303E−01 | −1.639186E−09 | −1.894486E−14 | −4.136066E−18 |
| M3 | −5.224549E−01 | −2.010111E−09 | −1.293006E−14 | −2.918315E−20 |
| M4 | −3.021297E−02 | 9.250522E−14 | 5.057734E−20 | 4.887335E−28 |
| M5 | −3.126684E+00 | 2.153833E−09 | 1.799694E−14 | −1.892202E−20 |
| M6 | 6.984230E−01 | −1.682769E−10 | −1.422157E−15 | 1.234832E−20 |

| Surface | D | E | F | G |
|---|---|---|---|---|
| M1 | 4.091038E−24 | −5.790509E−29 | 3.296826E−34 | 8.178384E−41 |
| M2 | 1.255234E−21 | −1.379809E−25 | 5.435466E−30 | −4.566966E−36 |
| M3 | 1.475407E−23 | −5.835055E−28 | 1.288505E−32 | −3.671165E−37 |
| M4 | 4.320243E−35 | 4.670696E−39 | −4.109431E−45 | 2.963010E−51 |
| M5 | −6.296522E−25 | 2.964336E−29 | 6.191151E−34 | −1.998284E−38 |
| M6 | −1.683381E−25 | 8.658821E−31 | −3.676860E−36 | −5.905802E−41 |

The projection optical system 7 shown in FIG. 6 is a six-mirror system, like that shown in FIG. 5. In this case, the first mirror group 24 also includes only the mirrors M1 and M2. The two mirrors M1 and M2 are supplied off-axis.

The mirror M1 is arranged adjacent to the opening 21 of the mirror M4. This arrangement is such that the opening 21 of the mirror M4 is only passed through once for the ray between the mirrors M2 and M3.

The projection optical system 7 shown in FIG. 6 has only a single intermediate image plane 27, which is spatially arranged, like the intermediate image planes 23 in the embodiments shown in FIGS. 2 to 5, between the last mirror in the light path, i.e. the mirror M6, and the image plane 9.

In the embodiment shown in FIG. 6, despite the fact that the opening 21 of the mirror M4 is passed though by a light beam plane 9 is approximately 0.8 times the distance of the last mirror M6 in the light path from the image plane 9.

The projection optical system 7 shown in FIG. 6 has a maximum (rms) wavefront error of 1.4 nm. The maximum distortion is 1.4 nm. The pupil obscuration is 16.8%.

Figure 7:
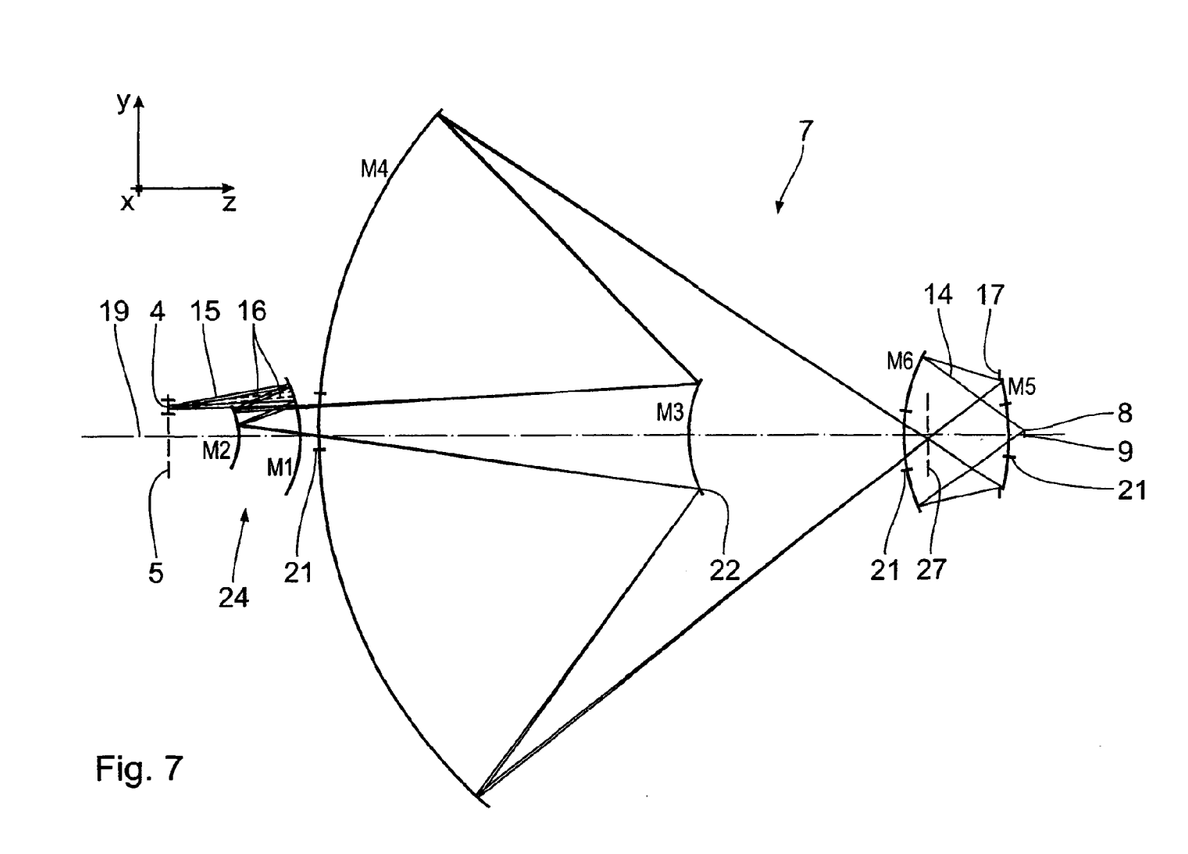
FIG. 7 is a view of an embodiment of an imaging optical system, in meridional section.

FIG. 7 shows a further embodiment of a projection optical system 7. Components and features which correspond to those that have previously been described with reference to FIGS. 1 to 5 have the same reference numerals and will not be discussed in detail again.

The optical data for the projection optical system 7 shown in FIG. 7 are shown in the following by means of two tables, which correspond in layout to the tables for FIG. 2.

| Surface | Radius (1/c) | Thickness | Operating mode |
|---|---|---|---|
| Object plane | infinity | 379.207 | |
| M1 | −509.962 | −179.207 | REFL |
| M2 | −318.440 | 1332.984 | REFL |
| M3 | 343.817 | −1093.195 | REFL |
| M4 | 1475.059 | 2039.667 | REFL |
| M5 | −609.119 | −28.006 | REFL |
| stop | infinity | −281.138 | |
| M6 | 562.495 | 354.144 | REFL |
| Image plane | infinity | 0.000 | |

-continued

| Surface | K | A | B | C |
|---|---|---|---|---|
| M1 | 1.484533E−01 | −5.739623E−10 | 9.023124E−14 | −7.365787E−18 |
| M2 | 5.827688E−01 | 3.542976E−09 | 1.241138E−13 | −3.596600E−17 |
| M3 | −1.284995E+00 | −4.653305E−09 | 1.019610E−13 | −3.037140E−18 |
| M4 | −4.865988E−02 | −1.091347E−13 | −6.628260E−21 | −4.841711E−28 |
| M5 | −4.572713E+00 | 2.517019E−09 | 7.268687E−16 | 6.794125E−19 |
| M6 | 8.759896E−01 | 1.726609E−10 | −2.501863E−15 | 1.688202E−20 |

| Surface | D | E | F | G |
|---|---|---|---|---|
| M1 | 3.807256E−22 | −1.215662E−26 | 2.193281E−31 | −1.712891E−36 |
| M2 | 9.673512E−21 | −1.599535E−24 | 1.493641E−28 | −5.987766E−33 |
| M3 | 9.767861E−23 | −2.436531E−27 | 3.766380E−32 | −2.616614E−37 |
| M4 | −3.662658E−33 | −1.445033E−38 | 1.208908E−44 | −4.273745E−51 |
| M5 | −1.846769E−23 | 4.603723E−28 | −6.890055E−33 | 4.664473E−38 |
| M6 | 1.453398E−25 | −6.794812E−30 | 8.060319E−35 | −3.545269E−40 |

Like the embodiments shown in FIGS. 5 and 6, the projection optical system 7 shown in FIG. 7 is also a six-mirror system. The construction of the first mirror group 24 comprising the mirrors M1 and M2 corresponds to that of the embodiment shown in FIG. 6. The embodiment according to FIG. 7 also has only one intermediate image plane, namely the intermediate image plane 27, which is arranged correspondingly to that shown in FIG. 6.

The projection optical system 7 shown in FIG. 7 has a numerical aperture of 0.60.

The distance between the fourth-last mirror M3 and the last mirror M6 is equal to approximately 25% of the distance of the object plane 5 from the image plane 9 in the embodiment of the projection optical system 7 shown in FIG. 7. The distance of the intermediate image plane 23 from the image plane 9 is approximately 0.8 times the distance of the last mirror M6 in the light path from the image plane 9.

The maximum (rms) wavefront error of the projection optical system 7 shown in FIG. 7 is 0.7 nm. The maximum distortion is 0.3 nm. The pupil obscuration is 16.0%.

To produce a microstructured or nanostructured component, the projection exposure system 1 is used as follows: Initially, the reflection mask 10, or the reticle and the substrate, or the wafer 11 is prepared. Subsequently, a structure on the reticle 10 is projected onto a light-sensitive layer of the wafer 11 by means of the projection exposure system 1. By developing the light-sensitive layer, a microstructure on the wafer 11, and thus the microstructured component, are then produced.

What is claimed is:

1. An imaging optical system which during operation directs light along a path to image an object field in an object plane to an image field in an image plane, the imaging optical system comprising:
   at least six mirrors positioned along an optical axis of the imaging optical system, where the at least six mirrors direct the light along the path,
   wherein at least one of the mirrors has an opening through which the light passes, and a distance along the optical axis between a fourth-last mirror in the path and a last mirror in the path is at least 10% of the distance between the object field and the image field along the optical axis,
   wherein the distance is between a piercing point of the optical axis and the fourth-last mirror and a piercing point of the optical axis and the last mirror,
   wherein the piercing point of the fourth-last mirror is a point where the optical axis passes a reflection surface of the fourth-last mirror or a point where the optical axis passes a surface which carries on continuously from the reflection surface of the fourth-last mirror based on the optical design of the fourth-last mirror, and the piercing point of the last mirror is a point where the optical axis passes a reflection surface of the last mirror or a point where the optical axis passes a surface which carries on continuously from the reflection surface of the last mirror based on the optical design of the last mirror.

2. The imaging optical system of claim 1, wherein the fourth-last mirror does not include an opening and shadows a central portion of a pupil plane of the imaging optical system.

3. The imaging optical system of claim 2, wherein the fourth-last mirror is a convex mirror.

4. The imaging optical system of claim 2, wherein the fourth-last mirror lies on an optical axis of the imaging optical system.

5. The imaging optical system of claim 2, wherein the fourth-last mirror is arranged in the region of a pupil plane of the imaging optical system.

6. The imaging optical system of claim 1, wherein the imaging optical system has an image field-side numerical aperture of at least 0.4.

7. The imaging optical system of claim 1, wherein the imaging optical system has a maximum root mean square wavefront error of less than 10 nm.

8. The imaging optical system of claim 1, wherein the imaging optical system has a maximum distortion of less than 10 nm.

9. The imaging optical system of claim 1, wherein the imaging optical system has a pupil obscuration of less than 20%.

10. The imaging optical system of claim 1, wherein the image plane is parallel to the object plane.

11. The imaging optical system of claim 1, wherein the image field is larger than 1 mm$^2$.

12. The imaging optical system of claim 1, wherein the image field is a rectangular or arc-shaped image field with a side length of 13 mm.

13. The imaging optical system of claim 1, wherein the imaging optical system has a reduction imaging scale of 8.

14. The imaging optical system of claim 1, wherein an odd number of mirrors of the imaging optical system have an opening through which the light passes.

15. The imaging optical system of claim 1, wherein the imaging optical system images the object field to at least one intermediate image between the object plane and the image plane, the at least one intermediate image being in a plane that is folded in the vicinity of a pupil plane of the imaging optical system.

16. The imaging optical system of claim 1, wherein principal rays in the light path between the object plane and a first of the mirrors in the light path extend divergently from neighbouring field points in the object field.

17. The imaging optical system of claim 1, wherein the imaging optical system includes exactly six mirrors and the imaging optical system images the object field to exactly two intermediate image between the object plane and the image plane.

18. The imaging optical system of claim 1, wherein a third-last mirror and a fifth-last mirror along the path before the image plane both include openings through which the light passes.

19. A projection exposure system for microlithography comprising:
   a light source;
   an illumination optical system; and
   the imaging optical system of claim 1,
   wherein during operation the light source provides light to the illumination optical system which directs the light to the object field of the imaging optical system.

20. The projection exposure system of claim 19, wherein the light provided by the light source has a wavelength between 10 nm and 30 nm.

21. The projection exposure system of claim 19, wherein the imaging optical system comprises at least eight mirrors positioned along the optical axis.

22. The projection exposure system of claim 19, wherein a fourth-last mirror along the path before the image field does not include an opening and shadows a central portion of a pupil plane of the imaging optical system.

23. A method for producing a microstructured component, the method comprising:
   providing a reticle and a wafer;
   projecting a structure on the reticle onto a light-sensitive layer on the wafer by using a projection exposure system; and
   producing a microstructure on the wafer based on the structure projected onto the light sensitive layer, wherein the projection exposure system comprises:
   a light source;
   an illumination optical system; and
   the imaging optical system of claim 1, and wherein during operation the light source provides light to the illumination optical system which directs the light to the object field of the imaging optical system.

24. The method of claim 23, wherein the imaging optical system comprises at least eight mirrors positioned along the optical axis.

25. The method of claim 23, wherein a fourth-last mirror along the path before the image field does not include an opening and shadows a central portion of a pupil plane of the imaging optical system.

26. The imaging optical system of claim 1, comprising at least eight mirrors positioned along the optical axis.

* * * * *

UNITED STATES PATENT AND TRADEMARK OFFICE
CERTIFICATE OF CORRECTION

PATENT NO. : 8,576,376 B2  
APPLICATION NO. : 12/767521  
DATED : November 5, 2013  
INVENTOR(S) : Hans-Juergen Mann Page 1 of 1

It is certified that error appears in the above-identified patent and that said Letters Patent is hereby corrected as shown below:

In the Specification

Col. 2, line 63, delete "thank" and insert -- than --.

Col. 4, line 7, delete "the a" and insert -- the --.

Col. 4, line 21, before "is" insert -- FIG. 4 --.

Col. 6, line 30, delete "++Ah$^4$" and insert -- +Ah$^4$ --.

Signed and Sealed this  
Eighteenth Day of February, 2014

Michelle K. Lee  
*Deputy Director of the United States Patent and Trademark Office*